United States Patent
Luo (10) Patent No.: US 12,408,380 B2
(45) Date of Patent: Sep. 2, 2025

(54) DISPLAY PANEL INCLUDING LIGHT-ABSORBING LAYER

(71) Applicant: SHENZHEN CHINA STAR OPTOELECTRONICS SEMICONDUCTOR DISPLAY TECHNOLOGY CO., LTD., Shenzhen (CN)

(72) Inventor: Chuanbao Luo, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 630 days.

(21) Appl. No.: 17/436,142

(22) PCT Filed: Aug. 10, 2021

(86) PCT No.: PCT/CN2021/111704
§ 371 (c)(1),
(2) Date: Sep. 3, 2021

(87) PCT Pub. No.: WO2022/247017
PCT Pub. Date: Dec. 1, 2022

(65) Prior Publication Data
US 2022/0384767 A1    Dec. 1, 2022

(30) Foreign Application Priority Data

May 25, 2021    (CN) .......................... 202110571662.4

(51) Int. Cl.
*H10K 50/86*    (2023.01)
*H10D 30/67*    (2025.01)
*H10K 71/00*    (2023.01)

(52) U.S. Cl.
CPC ....... *H10K 50/865* (2023.02); *H10D 30/6755* (2025.01); *H10D 30/6757* (2025.01); *H10K 71/00* (2023.02)

(58) Field of Classification Search
CPC .. H10K 50/865; H10K 71/00; H01L 29/7869; H01L 29/78696; H10D 30/6757; H10D 30/6755
(Continued)

(56) References Cited

U.S. PATENT DOCUMENTS

| 2009/0141060 A1* | 6/2009 | Kwon | ................... G02B 5/201 |
| | | | 347/14 |
| 2011/0139063 A1* | 6/2011 | Rannou | ................... C30B 29/54 |
| | | | 117/5 |

(Continued)

FOREIGN PATENT DOCUMENTS

| CN | 101840117 A | 9/2010 |
| CN | 103367165 A | 10/2013 |

(Continued)

*Primary Examiner* — Eric W Jones
(74) *Attorney, Agent, or Firm* — The Roy Gross Law Firm, LLC; Roy D. Gross (57) ABSTRACT

The present application provides a display panel and a manufacturing method thereof, wherein a projection of a light-absorbing layer in the display panel on a base substrate covers a projection of a gap between a first electrode and a second electrode on the base substrate, so as to absorb ambient light directly or indirectly irradiated on a channel region through the gap between a first electrode and a second electrode, so that the channel region on a first metal layer is well protected, which greatly reduces the problem of performance degradation of the channel region of an active layer caused by irradiation of the external ambient light.

16 Claims, 3 Drawing Sheets

(58) Field of Classification Search
USPC .................................................. 257/40, 59
See application file for complete search history.

(56) References Cited

U.S. PATENT DOCUMENTS

| | | |
|---|---|---|
| 2011/0287593 A1 | 11/2011 | Endo et al. |
| 2014/0147967 A1* | 5/2014 | Park .................... H01L 29/7869 |
| | | 438/104 |
| 2014/0353599 A1* | 12/2014 | Kang .................. H10K 59/131 |
| | | 438/34 |
| 2016/0056220 A1* | 2/2016 | Kang ................ H10K 59/1213 |
| | | 257/40 |
| 2018/0308830 A1* | 10/2018 | Bonart .................. H01L 25/167 |
| 2018/0366590 A1* | 12/2018 | Nakamura ........ H01L 29/78645 |
| 2019/0173013 A1* | 6/2019 | Nakamura ............... B05D 1/26 |
| 2020/0161583 A1* | 5/2020 | Paek ................. H10K 50/8428 |
| 2021/0043707 A1* | 2/2021 | Park .................. H10K 59/1213 |
| 2021/0098519 A1 | 4/2021 | Hsu et al. |

FOREIGN PATENT DOCUMENTS

| | | |
|---|---|---|
| CN | 103762244 A | 4/2014 |
| CN | 104393024 A | 3/2015 |
| CN | 108110060 A | 6/2018 |
| CN | 112420739 A | 2/2021 |

\* cited by examiner

DISPLAY PANEL INCLUDING LIGHT-ABSORBING LAYER

CROSS REFERENCE TO RELATED APPLICATIONS

This application is a National Phase of PCT Patent Application No. PCT/CN2021/111704 having International filing date of Aug. 10, 2021, which claims the benefit of priority of Chinese Patent Application No. 202110571662.4, filed May 25, 2021, the contents of which are all incorporated herein by reference in their entirety.

BACKGROUND OF INVENTION

Field of Invention

The present application relates to the field of display technology, in particular to a display panel and a manufacturing method thereof.

Description of Prior Art

Mini-light-emitting diode (mini-LED) display panels and micro-light-emitting diode (micro-LED) display panels have high contrast, high color rendering performance and other features comparable to organic light-emitting diode (OLED) display panels, and have become a hot spot for major panel manufacturers.

Thin film transistors (TFTs) are currently the main driving elements in mini-LED displays, micro-LED displays, LCD displays, and OLED displays, and directly related to a development direction of high-performance flat panel display devices. Thin film transistors have a variety of structures, and there are also a variety of materials for preparing active layers of thin film transistors with corresponding structures. Metal oxide thin film transistors (metal oxide TFTs) have characteristics of high field-effect mobility ($\geq 10$ cm2/V·s), simple preparation process, good uniformity in large-area deposition, fast response times, high transmittance in the visible light range, and so forth, and therefore are considered to be the most potential backplane technology for development of displays in a direction of large size and flexibility.

In structures of current metal oxide thin film transistor display panels, ambient light can be reflected by a metal light-shielding layer and a gate and enter a channel region formed by a metal oxide semiconductor material, resulting in performance degradation of the channel region, thus impacting stability of the metal oxide thin film transistor display panels.

SUMMARY OF INVENTION

Embodiments of the present application provide a display panel and a manufacturing method thereof, which can solve the problem of performance degradation of a channel region caused by an influence of external environmental light in the channel region in the existing display panel.

In one aspect, an embodiment of the present application provides a display panel, including: a base substrate, a light-absorbing layer, and a driving circuit layer stacked in sequence, wherein the driving circuit layer includes a first metal layer and an active layer, the first metal layer includes a first electrode and a second electrode spaced apart in a same layer, and the active layer is disposed on the first metal layer and includes a channel region; and wherein a vertical projection of the light-absorbing layer on the base substrate covers a vertical projection of a gap between the first electrode and the second electrode on the base substrate.

Optionally, the active layer includes the channel region made of a semiconductor metal oxide material, the first electrode is a source, the second electrode is a drain, and a vertical projection of the drain on the base substrate covers a vertical projection of the channel region on the base substrate.

Optionally, the light-absorbing layer includes a thiophene-based organic semiconductor material.

Optionally, the vertical projection of the light-absorbing layer on the base substrate coincides with the vertical projection of the gap on the base substrate.

Optionally, the light-absorbing layer is disposed on an entire surface of the base substrate.

Optionally, the driving circuit layer further includes a gate insulating layer and a second metal layer stacked on the active layer in sequence, the second metal layer includes a gate, and the gate is disposed corresponding to the channel region; and wherein the second metal layer is composed of an anti-reflection layer and a stacked metal layer, and the anti-reflection layer is located between the stacked metal layer and the gate insulating layer.

Optionally, the anti-reflection layer is an indium zinc oxide film; and the stacked metal layer is a composite metal layer made of copper and molybdenum.

Optionally, the active layer further includes a non-channel region, the non-channel region is formed by conducting a semiconductor metal oxide material, the first electrode and the second electrode are electrically connected to the channel region through the non-channel region, and the active layer has a thickness of 300 angstroms to 500 angstroms.

Optionally, a first buffer layer is further provided between the light-absorbing layer and the first metal layer, and the first buffer layer is a silicon oxide layer.

In another aspect, an embodiment of the present application also discloses a method of manufacturing a display panel, including:

providing a base substrate;

forming a light-absorbing layer on the base substrate, wherein the light-absorbing layer is subjected to baking and thermal curing; and forming a drive circuit layer on the light-absorbing layer, wherein the drive circuit layer includes a first metal layer and an active layer, the first metal layer includes a first electrode and a second electrode spaced apart in a same layer, and the active layer is disposed on the first metal layer and includes a channel region; and wherein a vertical projection of the light-absorbing layer on the base substrate covers a vertical projection of a gap between the first electrode and the second electrode on the base substrate.

BENEFICIAL EFFECT

In the display panel and the manufacturing method thereof disclosed in the present application, ambient light directly or indirectly irradiated on a channel region through a gap between a first electrode and a second electrode can be absorbed by providing a light-absorbing layer, so that the channel region on a first metal layer is well protected, which greatly reduces the problem of performance degradation of the channel region of an active layer caused by irradiation of the external ambient light.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

The following disclosure provides many different embodiments or examples for realizing different structures of the present application. To simplify the disclosure of the present application, the components and settings of specific examples are described below. Of course, they are only examples and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the applications of other processes and/or the use of other materials.

The present application provides a display panel and a manufacturing method thereof. The display panel includes a base substrate, a light-absorbing layer, and a driving circuit layer stacked in sequence, wherein the driving circuit layer includes a first metal layer and an active layer, the first metal layer includes a first electrode and a second electrode spaced apart in a same layer, and the active layer is disposed on the first metal layer and includes a channel region; and wherein a vertical projection of the light-absorbing layer on the base substrate covers a vertical projection of a gap between the first electrode and the second electrode on the base substrate. In the display panel and the manufacturing method thereof disclosed in the present application, ambient light directly or indirectly irradiated on a channel region through a gap between a first electrode and a second electrode can be absorbed by providing a light-absorbing layer, so that the channel region on a first metal layer is well protected, which greatly reduces the problem of performance degradation of the channel region of an active layer caused by irradiation of the external ambient light.

Embodiment 1

Figure 1:
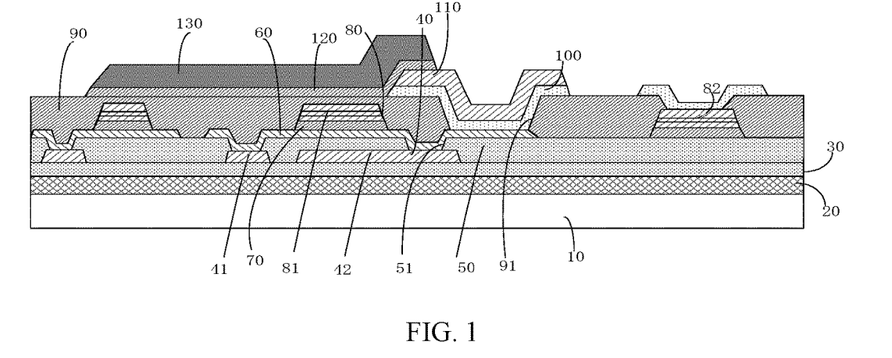
FIG. 1 is a schematic structural diagram of a display panel disclosed in Embodiment 1 of the present application.

FIG. 1 is a schematic structural diagram of a display panel disclosed in an embodiment of the present application. As shown in FIG. 1, the display panel includes: a base substrate 10, a light-absorbing layer 20, a first buffer layer 30, and a driving circuit layer stacked in sequence. The driving circuit layer includes a first metal layer 40, a second buffer layer 50, an active layer 60, a gate insulating layer 70, a second metal layer 80, a first passivation protection layer 90, an indium tin oxide layer 100, a third metal layer 110, a second passivation protection layer 120, and an LED light-shielding layer 130 stacked in sequence. The driving circuit layer is provided with a light-emitting unit 140.

In this embodiment, the base substrate 10 is made of, for example, glass, plastic, polyimide, or other inorganic or organic materials. Specifically, it may be a flat or curved rigid substrate, or a bendable flexible substrate.

In this embodiment, the base substrate 10 is provided with a light-absorbing layer 20 and a driving circuit layer. The light-absorbing layer 20 is, for example, provided on an entire surface of the base substrate 10, and the driving circuit layer is formed with a thin film transistor structure. The thin film transistor structure includes a source and a drain arranged spaced apart from each other, and a channel located above the source and the drain. A vertical projection of the light-absorbing layer 20 on the base substrate 10 covers a vertical projection of a gap between the source and drain on the base substrate 10, thereby preventing ambient light from irradiating the channel through the gap to cause a problem of performance deterioration of thin film transistors.

In this embodiment, the light-absorbing layer 20 is specifically a P-type organic semiconductor layer, which is made of, for example, a thiophene-based organic semiconductor material with a strong light response characteristic to reduce an influence of external ambient light on the channel region. Specifically, the light-absorbing layer may be made of a thiophene-based organic semiconductor with a strong light response characteristic, such as 5,11-bis(triethylsilylethynyl) o-dithiophene (DiF-TESADT). Compared with amorphous silicon (a-Si) materials, a C—H bonding energy of DiF-TESADT is 414 KJ/mol, and a Si—H bonding energy is 377 KJ/mol, which possess advantages of lower hydrogen content and higher chemical stability, so that while ensuring a good light-absorbing effect, a problem of contamination of the channel region of the active layer 60 caused by introduction of hydrogen ions is well prevented. It should be noted that components of the light-absorbing layer 20 in this embodiment may only include thiophene-based organic semiconductor materials, or may also include or be doped with components other than the thiophene-based organic semiconductor materials.

In this embodiment, the driving circuit layer includes the first metal layer 40 and the active layer 60. The first metal layer 40 includes a first electrode 41 and a second electrode 42 spaced apart in the same layer. The gap is formed between the first electrode 41 and the second electrode 42. The active layer 60 is disposed on the first metal layer 40 and includes the channel region. The vertical projection of the light-absorbing layer 20 on the base substrate 10 covers the vertical projection of the gap between the first electrode 41 and the second electrode 42 on the base substrate 10, thereby preventing ambient light from directly or indirectly irradiating the channel region through the gap to cause the problem of the performance deterioration of the thin film transistor.

In this embodiment, the first metal layer 40 is made of, for example, an opaque metal material, and the vertical projection of the second electrode 42 in the first metal layer 40 on the base substrate 10 at least covers the vertical projection of the channel region in the thin film transistor structure on the base substrate 10, so that the second electrode 42 is also served as a light-shielding layer to effectively prevent the ambient light from a side of the base substrate 10 from directly entering a side of the channel region close to the base substrate 10, thereby preventing a problem of an increase in the manufacturing process caused by an additional light-shielding layer under the channel region.

In this embodiment, the first electrode 41 is, for example, the source in the thin film transistor structure, and the second electrode 42 is, for example, the drain in the thin film transistor structure. Of course, this embodiment does not limit electrode types of the first electrode 41 and the second electrode 42. In other embodiments of the present application, the first electrode 41 may also be a drain in a thin film transistor structure, and the second electrode 42 may also be a source in a thin film transistor structure.

In this embodiment, the type of the thin film transistor structure is, for example, a metal oxide thin film transistor, and the active layer 60 includes, for example, the channel region made of a semiconductor metal oxide material. A blanket light-absorbing layer 20 below the metal oxide thin film transistor can well absorb ambient light, and prevent ambient light from directly or indirectly irradiating the channel region of the first active layer 60 through the gap. Further, the active layer 60 further includes, for example, a non-channel region, which is formed by conducting a semiconductor metal oxide material. The first electrode 41 is electrically connected to the second electrode 42 through the non-channel region. A thickness of the active layer is, for example, 300 angstroms to 500 angstroms. Of course, this embodiment does not limit the type of the thin film transistor structure, and in other embodiments of the present application, the type of the thin film transistor structure in the driving circuit layer may also be an amorphous silicon thin film transistor or a low temperature polysilicon thin film transistor. The type of thin film transistor structure may be one or more. For example, the driving circuit layer may include both a low-temperature polysilicon thin film transistor and a metal oxide thin film transistor.

In this embodiment, the driving circuit layer further includes a gate insulating layer 70 and a second metal layer 80 stacked on the active layer 60. The second metal layer 80 includes a gate 81 in the thin film transistor structure and a bonding portion 82 for connecting an external electrical signal. That is, the structure of the thin film transistor is a TOP gate structure with a gate 81 located above the active layer 60, and the gate 81 is arranged corresponding to the channel region of the thin film transistor. In the thin film transistor structure, since the gate 81 and the second electrode 42 are respectively provided above and below the channel region, in absence of the light-absorbing layer 20, the ambient light on a side of the base substrate 10 away from the channel region can irradiate the gate 81 through the gap between the first electrode 41 and the second electrode 42, and then be reflected by the gate 81 to pass through the channel region and irradiate the second electrode 42. Thus, the ambient light incident between the gate 81 and the second electrode 42 will repeatedly irradiate the channel region through multiple reflections. Therefore, the presence of the light-absorbing layer 20 can well prevent the ambient light on a side of the base substrate 10 away from the channel region from directly or indirectly irradiating the channel region through the gap between the first electrode 41 and the second electrode 42.

In this embodiment, the second metal layer 80 includes an anti-reflection layer and a stacked metal layer, and the anti-reflection layer is located between the stacked metal layer and the gate insulating layer 70. The anti-reflection layer can reduce the ambient light incident on the driving circuit layer to reflect on the surface of the gate 81 close to the channel region, and further reduce the problem of the performance degradation of the thin film transistor caused by the ambient light irradiating the channel region. It should be noted that the ambient light incident into the driving circuit layer includes the ambient light incident from opposite sides of the display panel.

In this embodiment, the anti-reflection layer is an indium zinc oxide film; and the stacked metal layer is a composite metal layer made of copper and molybdenum.

In this embodiment, for example, a first buffer layer 30 is further provided between the light-absorbing layer 20 and the first metal layer 40, and made of a material which is, for example, silicon oxide with stable performance. Since the light-absorbing layer 20 is an organic layer, the first buffer layer 30 can prevent a layer directly formed on the light-absorbing layer 20 from stress mismatching with the light-absorbing layer 20 in the subsequent manufacturing process, which may cause peeling off.

In this embodiment, a second buffer layer 50 is further provided between the first metal layer 40 and the active layer 60. The second buffer layer 50 may be a single-layered buffer layer made of silicon oxide or a stacked buffer layer made of silicon oxide and silicon nitride. The second buffer layer 50 is formed with a first-type via hole 51 at a position corresponding to the first electrode 41 and the second electrode 42, and the active layer 60 is filled in the first-type via hole 51 and in contact with the first electrode 41 and the second electrode 42 to achieve electrical connection.

In this embodiment, for example, a first passivation protection layer 90 and an indium tin oxide layer 100 are further stacked on the second metal layer 80. The first passivation protection layer 90 is provided with a second-type via hole 91 on the non-channel area electrically connected to the second electrode 42 and at a position corresponding to the bonding portion 82. The indium tin oxide layer 100 includes a plurality of pixel electrodes located in the display area and a thermal oxidation protection layer terminal located in the non-display area. The plurality of pixel electrodes and thermal oxidation protection layer terminal are formed by patterning the indium tin oxide layer 100. The pixel electrode is electrically connected to the non-channel region of the active layer 60 through the second-type via hole 91, and further electrically connected to the second electrode 42 of the first metal layer 40 through the conductive non-channel region. The thermal oxidation protection layer terminal is electrically connected to the bonding portion of the second metal layer 80 through the second-type via hole 91.

In this embodiment, a third metal layer 110, a second passivation protection layer 120, and an LED light-shielding layer 130 are stacked on the indium tin oxide layer 100 in sequence, wherein the third metal layer 110 includes a plurality of LED bonding terminals arranged corresponding to the plurality of pixel electrodes, and the LED bonding terminals are electrically connected to the light-emitting unit 140. The LED light-shielding layer 130 is arranged above the thin film transistor structure to shield the ambient light on the side of the channel region away from the base substrate 10.

Embodiment 2

Figure 2A:
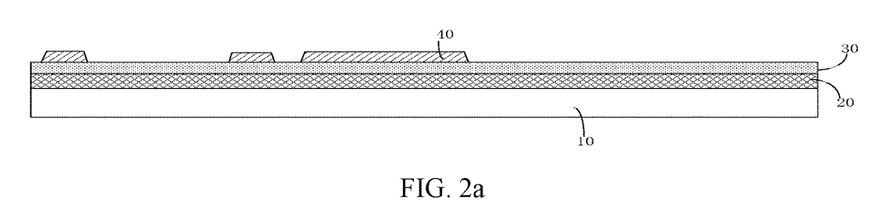
FIG. 2a is one of the schematic diagrams of a manufacturing process of a display panel disclosed in Embodiment 2 of the present application.

This embodiment discloses a method of manufacturing a display panel to form the display panel in Embodiment 1. Specifically, FIG. 2a is one of the schematic diagrams of the manufacturing process of the display panel disclosed in an embodiment of the present application, which specifically shows layer structures including a base substrate, a light-absorbing layer, a first buffer layer, and a first metal layer. As shown in FIG. 1 and FIG. 2a, a base substrate 10 is provided. The base substrate 10 is made of, for example, glass, plastic, polyimide, or other inorganic or organic materials. Specifically, it may be a flat or curved rigid substrate, or a bendable flexible substrate.

The light-absorbing layer 20 is arranged on an entire surface of the base substrate 10, thereby reducing or eliminating a phenomenon of increased light irradiation on the channel region caused by the ambient light from a side of the base substrate 10 directly irradiating the channel region of the active layer or by multiple reflections between the gate and the first substrate, to prevent the performance deterioration of the metal oxide thin film transistor. Preferably, the light-absorbing layer 20 may be specifically formed by coating on an entire surface of the base substrate 10, and the light-absorbing layer 20 is formed into a stable form after curing by ultraviolet irradiation and high-temperature thermal baking. In other embodiments of the present application, the light-absorbing layer 20 may also be formed on the base substrate 10 by thin film deposition or other methods. In this embodiment, a blanket light-absorbing layer 20 is provided, which can better absorb the ambient light from opposite sides of the display panel, and reduce or eliminate a phenomenon of increased light irradiation on the channel region caused by the ambient light from a side of the base substrate 10 incident on the gate of the second metal layer 80 through multiple reflections between the gate and the first metal layer 40. Meanwhile, since a patterning process is not required, a number of photomasks can be reduced, and process cost can be reduced. A thickness of the light-absorbing layer 20 is, for example, 1 to 3 microns, and the thermal baking is performed at a temperature of 200-250° C. for 1 to 2 hours. After the baking process, the light-absorbing layer 20 within the above-mentioned thickness range has excellent film-formation properties and optical properties.

The display panel, for example, further includes a first buffer layer 30 disposed between the light-absorbing layer 20 and the driving circuit layer. A material of the first buffer layer 30 is, for example, silicon oxide with stable performance. Since the light-absorbing layer 20 is an organic layer, the first buffer layer 30 can prevent a layer directly formed on the light-absorbing layer 20 from stress mismatching with the light-absorbing layer 20 in the subsequent manufacturing process, which may cause peeling off. Specifically, the first buffer layer 30 is, for example, a silicon oxide layer formed on the light-absorbing layer 20 by chemical vapor deposition (CVD) after the light-absorbing layer 20 is subjected to a high-temperature thermal curing treatment. Preferably, the first buffer layer 30 is disposed on an entire surface of the light-absorbing layer 20.

The driving circuit layer of the display panel includes, for example, an opaque first metal layer 40, and the first metal layer 40 includes a first electrode 41 and a second electrode 42. The vertical projection of the second electrode 42 in the first metal layer 40 on the base substrate 10 at least covers the vertical projection of the channel region in the thin film transistor structure on the base substrate 10, so that the second electrode 42 is also served as a light-shielding layer to effectively prevent the ambient light from a side of the base substrate 10 from directly entering a side of the channel region close to the base substrate 10, thereby preventing a problem of an increase in the manufacturing process caused by an additional light-shielding layer under the channel region. The first metal layer 40 is formed on the first buffer layer 30 by, for example, physical vapor sputtering deposition (PVD). The first metal layer 40 may be a single metal layer made of molybdenum (Mo) or a stacked layer made of molybdenum (Mo)/copper (Cu). The first metal layer 40 is patterned by a wet etching process to form the first electrode 41 and the second electrode 42. The wet etching process uses, for example, hydrogen peroxide (H2O2)-based medical solution as an etchant, and a thickness of the first metal layer 40 is, for example, 5000 angstroms to 8000 angstroms. In other embodiments, the first metal layer 40 further includes an anti-reflection layer made of IZO, and the anti-reflection layer is, for example, superimposed on a single-layered metal layer made of molybdenum (Mo) or a stacked metal layer made of molybdenum (Mo)/copper (Cu) to reduce an amount of ambient light directly or indirectly irradiating on the first metal layer and causing reflection.

Figure 2B:
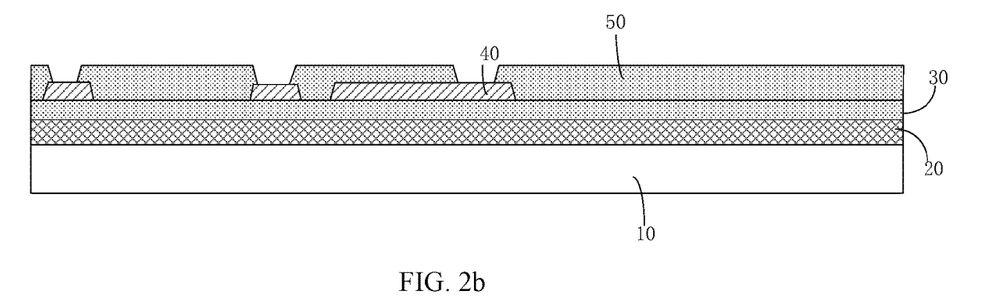
FIG. 2b is another one of the schematic diagrams of the manufacturing process of a display panel disclosed in Embodiment 2 of the present application.

Referring to FIG. 2b, the driving circuit layer of the display panel, for example, further includes a second buffer layer 50 formed on the first metal layer 40. The second buffer layer 50 may be a single-layered buffer layer made of silicon oxide or a stacked buffer layer made of silicon oxide and silicon nitride, and the second buffer layer 50 is formed by, for example, chemical vapor deposition. After the second buffer layer 50 is formed on the entire surface of the first metal layer 40, the second buffer layer 50 is patterned and formed with a plurality of first-type via holes 51 by etching, and the plurality of first-type via holes 51 are correspondingly disposed on the first electrode 41 and the second electrode 42 of the first metal layer 40. After forming the plurality of first-type via holes 51, the second buffer layer 50 is subjected to a high temperature annealing treatment for 2-3 hours at a temperature of 300-400° C.

Figure 2C:
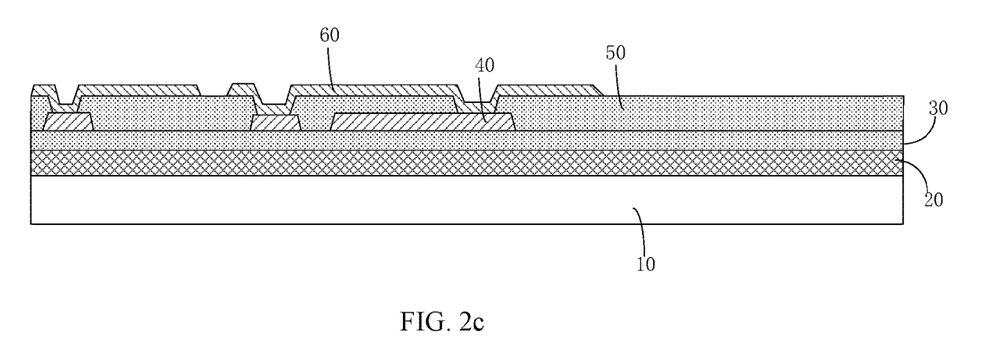
FIG. 2c is yet another one of the schematic diagrams of the manufacturing process of a display panel disclosed in Embodiment 2 of the present application.

Referring to FIG. 2c, the driving circuit layer of the display panel, for example, further includes an active layer 60 formed on the second buffer layer 50. The active layer 60 includes a channel region and a non-channel region, and the non-channel region is respectively connected to the first electrode 41 and the second electrode 42 of the first metal layer 40 through the plurality of first-type via holes 51 on the second buffer layer 50. A material of the active layer 60 is, for example, indium gallium zinc oxide (IGZO), indium gallium zinc tin oxide (IGZTO), indium gallium tin oxide (IGTO), or other semiconductor metal oxides. Metal oxide thin film transistors formed by using a semiconductor metal oxide material such as IGZO, IGZTO, IGTO, etc. have the characteristics of high field-effect mobility, simple preparation process, good uniformity of large-area deposition, fast response times and high transmittance in the visible light range, which can be applied to display panels and mini-LED and micro-LED display devices to effectively solve the problem of large voltage power consumption of metal lines caused by relatively high metal wiring voltage due to high current required by an LED chip. Meanwhile, since the semiconductor metal oxide is more sensitive to hydrogen in a film, in this embodiment, the light-absorbing layer 20 made of a thiophene-based organic semiconductor material with lower hydrogen content and higher chemical stability can ensure a good light-absorbing effect, while preventing the deterioration of the transistor caused by an introduction of hydrogen. A thickness of the active layer is, for example, 300 angstroms to 500 angstroms.

Figure 2D:
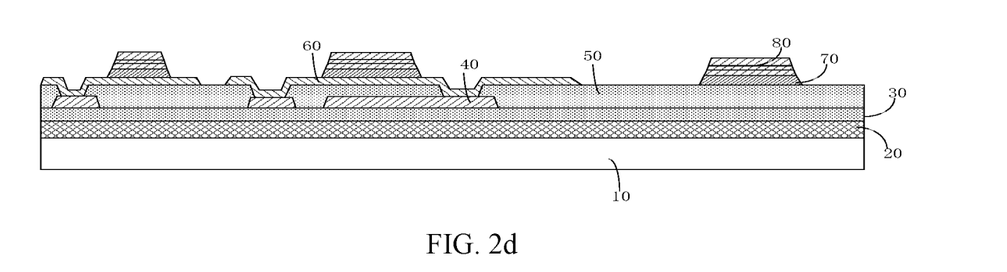
FIG. 2d is still another one of the schematic diagrams of the manufacturing process of a display panel disclosed in Embodiment 2 of the present application.

Referring to FIG. 2d, the driving circuit layer of the display panel, for example, further includes a gate insulating layer 70 and a second metal layer 80 formed on the active layer 60, and the second metal layer 80 includes a gate disposed corresponding to the channel region of the active layer 60, and further includes a bonding portion. The gate insulating layer 70 and the second metal layer 80 are specifically formed by continuous deposition. After the stacked structure of the gate insulating layer 70 and the second metal layer 80 is formed, for example, after the patterning of the gate is completed by a self-aligned gate process, plasma is used to treat the active layer 60, so that the non-channel region of the active layer 60 is conductive and has characteristics of a conductor. The second metal layer 80 adopts, for example, a three-layered stack structure of IZO/Mo/Cu, and the second metal layer 80 can reduce a light reflectivity of a surface of the second metal layer 80. Specifically, the Mo metal layer is provided between the IZO metal layer and the Cu metal layer, the IZO is provided on a side of the Mo metal layer close to the gate insulating layer 70, and the Cu metal layer is provided on a side of the Mo metal layer away from the gate insulating layer 70. As a low-reflection functional layer, IZO can reduce the light reflectivity of a side of the second metal layer 80 on the gate insulating layer 70. A thickness of the IZO layer is controlled in a relatively thin range, for example, from 150 angstroms to 300 angstroms. A material of the gate insulating layer 70 may be a single-layered film made of silicon oxide or a stacked structure made of at least two of silicon oxide, silicon nitride, or aluminum oxide, with a thickness of 2000 angstroms to 5000 angstroms.

Figure 2E:
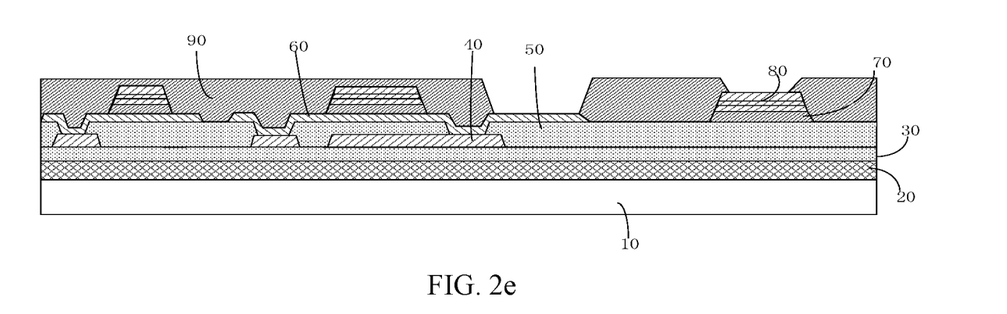
FIG. 2e is also another one of the schematic diagrams of the manufacturing process of a display panel disclosed in Embodiment 2 of the present application.

Referring to FIG. 2e, the driving circuit layer of the display panel, for example, further includes a first passivation protection layer 90 formed on the second metal layer 80. The first passivation protection layer 90 is formed, for example, by chemical weather deposition. After the first passivation protection layer 90 is formed on an entire surface of the second metal layer 80, the first passivation protection layer 90 is patterned and formed with a plurality of second-type via holes 91 by etching. The plurality of second-type via holes 91 are formed on the non-channel region corresponding to the active layer 60 and on the bonding portion. The first passivation protection layer 90 may be a single-layered film made of silicon oxide or a stacked structure made of at least two materials of silicon oxide, silicon nitride, or aluminum oxide, with a thickness ranging between 2000 angstroms and 5000 angstroms.

Figure 2F:
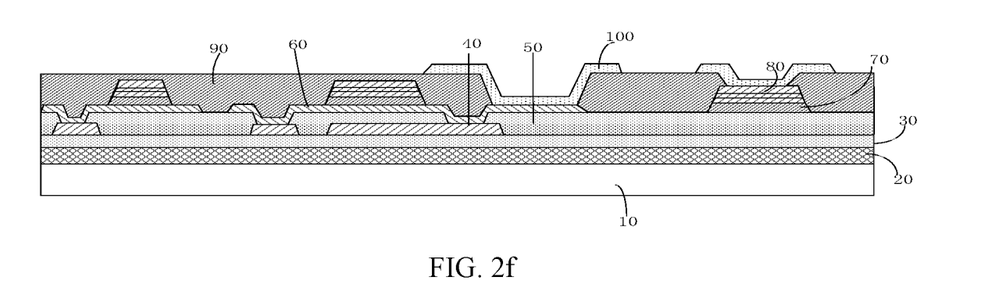
FIG. 2f is yet another one of the schematic diagrams of the manufacturing process of a display panel disclosed in Embodiment 2 of the present application.

Referring to FIG. 2f, the display panel, for example, further includes an indium tin oxide (ITO) layer 100 formed on the first passivation protection layer 90 of the driving circuit layer, and the indium tin oxide layer 100 is deposited, for example, by physical vapor deposition. The indium tin oxide layer 100 includes a plurality of pixel electrodes located in the display area and a thermal oxidation protection layer terminal located in the non-display area. The plurality of pixel electrodes and the thermal oxidation protection layer terminals are formed by patterning the indium tin oxide layer 100. The pixel electrodes are electrically connected to the non-channel region of the active layer 60 through the second-type via holes 91, and then are electrically connected to the drain of the first metal layer 40 through the conductive non-channel region. The thermal oxidation protective layer terminal is electrically connected to the bonding portion of the second metal layer 80 through the second-type via hole 91.

Figure 2G:
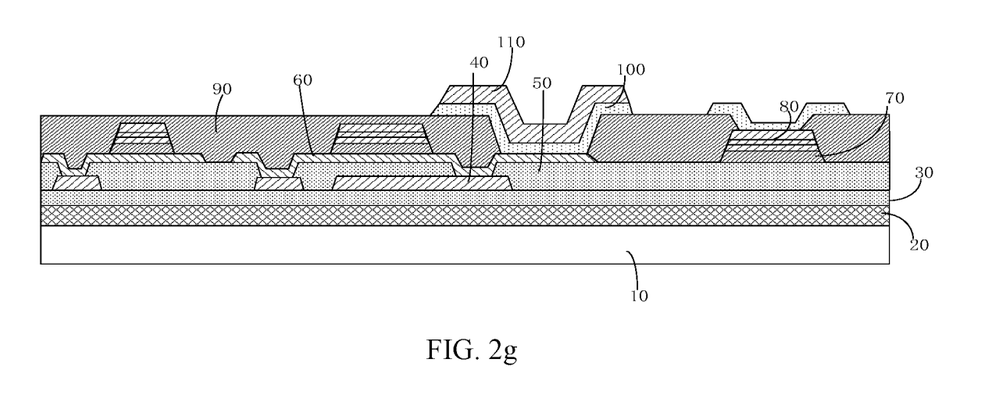
FIG. 2g is further another one of the schematic diagrams of the manufacturing process of a display panel disclosed in Embodiment 2 of the present application.

Referring to FIG. 2g, the display panel, for example, further includes a third metal layer 110 formed on the indium tin oxide layer 100, and the third metal layer 110 includes a plurality of LED bonding terminals arranged corresponding to the plurality of pixel electrodes. The third metal layer 110 is obtained by, for example, physical vapor deposition. The third metal layer 110 may be a single metal layer made of Cu or a stacked metal layer made of Cu/Mo. The plurality of LEDs bonding terminals are obtained by, for example, a wet etching process on the third metal layer 110.

Figure 2H:
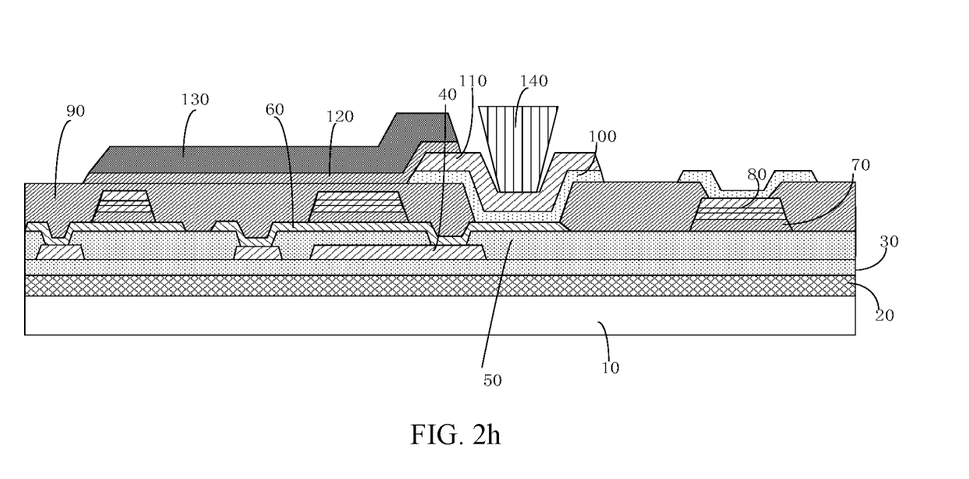
FIG. 2h is still another one of the schematic diagrams of the manufacturing process of a display panel disclosed in Embodiment 2 of the present application.

Referring to FIG. 2h, the display panel, for example, further includes a second passivation protection layer 120 and an LED light-shielding layer 130 stacked on the third metal layer 110 in sequence. Specifically, after the second passivation protection layer 120 is disposed on an entire surface of the third metal layer 110, a black matrix (BM) or other highly light-shielding photoresist material is patterned to form the LED light-shielding layer 130, and the LED light-shielding layer 130 includes a plurality of light-shielding patterns arranged corresponding to the thin film transistors of the driving circuit layer, and the second passivation protection layer 120 is patterned by using the plurality of light-shielding patterns as a mask. The second passivation protection layer 120 may be a single-layered film made of silicon oxide or a stacked structure made of at least two materials of silicon oxide, silicon nitride, or aluminum oxide, with a thickness ranging between 2000 angstroms and 5000 angstroms.

In this embodiment, the display panel further includes a plurality of light-emitting units 140. The light-emitting units 140 are, for example, LED driving chips, and each of the LED driving chips is correspondingly disposed on the LED bonding terminals. The display panel is formed, for example, by performing solder paste printing, anisotropic conductive film attachment, and LED chip mass transfer processes on the display panel. Of course, this embodiment does not limit a size of each of the LED driving chips, which may be, for example, a micro-LED driving chip, a mini-LED driving chip, or an LED chip of a regular package substrate. In other embodiments, the light-emitting unit 140 may also be an OLED light-emitting unit, for example.

Embodiment 3

Figure 3:
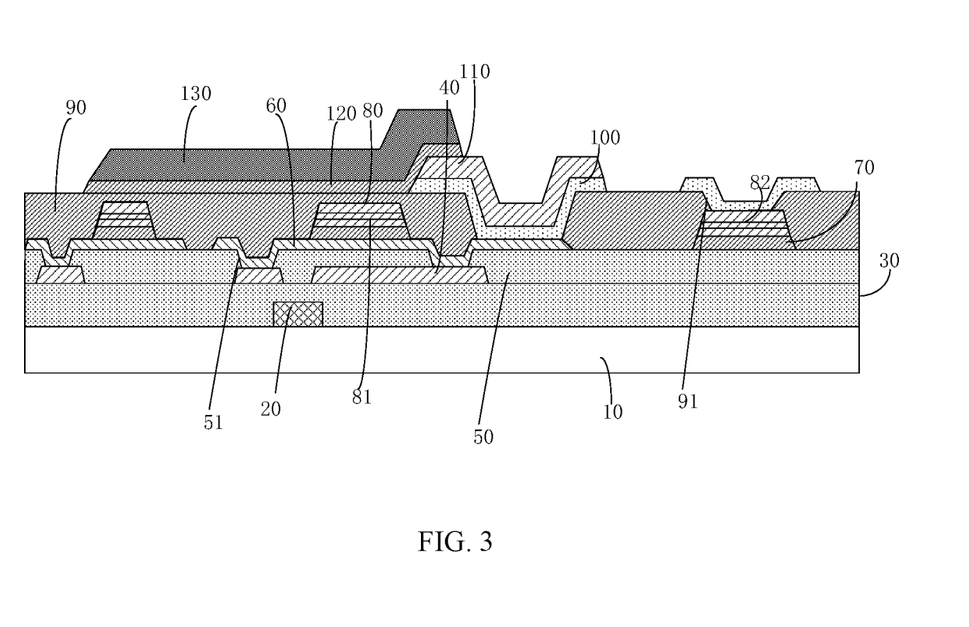
FIG. 3 is a schematic structural diagram of another display panel disclosed in Embodiment 3 of the present application.

Referring to FIG. 3, the present application discloses a display panel and a manufacturing method thereof. The display panel and the manufacturing method thereof are similar to the structure of the display panel disclosed in Embodiment 1 and the method of manufacturing the display panel disclosed in Embodiment 2, the same parts will not be repeated for brevity in this embodiment, and a difference therebetween is that the light-absorbing layer 20 in this embodiment is disposed on the base substrate 10 by patterning, and a vertical projection of the patterned light-absorbing layer 20 on the first metal layer 40 can cover at least a gap between the first electrode 41 and the second electrode 42, so as to effectively prevent the problem of performance degradation of the thin film transistor caused by external ambient light directly or original translation indirectly irradiating a channel region through the gap, while saving a material of the light-absorbing layer 20, thereby reducing manufacturing cost. Of course, the present application does not specifically limit the patterning method of the light-absorbing layer 20. In other embodiments of the present application, the light-absorbing layer 20 may, for example, cover the gap while also covering the first electrode 41 and the second electrode 42.

In summary, the present application provides a display panel and a manufacturing method thereof. The display panel includes: a base substrate, a light-absorbing layer, and a driving circuit layer stacked in sequence, wherein the driving circuit layer includes a first metal layer and an active layer, the first metal layer includes a first electrode and a second electrode spaced apart in a same layer, and the active layer is disposed on the first metal layer and includes a channel region; and wherein a vertical projection of the light-absorbing layer on the base substrate covers a vertical projection of a gap between the first electrode and the second electrode on the base substrate. In the display panel and the manufacturing method thereof disclosed in the present application, ambient light directly or indirectly irradiated on a channel region through a gap between a first electrode and a second electrode can be absorbed by providing a light-absorbing layer, so that the channel region on a first metal layer is well protected, which greatly reduces the problem of performance degradation of the channel region of an active layer caused by irradiation of the external ambient light.

The display panel and the display device provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A display panel, comprising: a base substrate, a light-absorbing layer, and a driving circuit layer stacked in sequence, wherein the driving circuit layer comprises a first metal layer and an active layer, the first metal layer comprises a first electrode and a second electrode spaced apart in a same layer, and the active layer is disposed on the first metal layer and comprises a channel region; and
    wherein a vertical projection of the light-absorbing layer on the base substrate covers a vertical projection of a gap between the first electrode and the second electrode on the base substrate;
    wherein the vertical projection of the light-absorbing layer on the base substrate coincides with the vertical projection of the gap on the base substrate;
    wherein the active layer comprises at least one via hole, and a vertical protection of the via hole on the base substrate does not overlap the vertical projection of the light-absorbing layer on the base substrate; and
    wherein the display panel further comprises an LED light-shielding layer disposed on a side of the driving circuit layer away from the light-absorbing layer, and a vertical protection of the LED light-shielding layer on the base substrate covers the vertical protection of the via hole on the base substrate.

2. The display panel according to claim 1, wherein the active layer comprises the channel region made of a semiconductor metal oxide material, the first electrode is a source, the second electrode is a drain, and a vertical projection of the drain on the base substrate covers a vertical projection of the channel region on the base substrate.

3. The display panel according to claim 2, wherein the light-absorbing layer comprises a thiophene-based organic semiconductor material.

4. The display panel according to claim 2, wherein the driving circuit layer further comprises a gate insulating layer and a second metal layer stacked on the active layer in sequence, the second metal layer comprises a gate, and the gate is disposed corresponding to the channel region; and
    wherein the second metal layer is composed of an anti-reflection layer and a stacked metal layer, and the anti-reflection layer is located between the stacked metal layer and the gate insulating layer.

5. The display panel according to claim 4, wherein the anti-reflection layer is an indium zinc oxide film; and the stacked metal layer is a composite metal layer made of copper and molybdenum.

6. The display panel according to claim 2, wherein the active layer further comprises a non-channel region, the non-channel region is formed by conducting a semiconductor metal oxide material, the first electrode and the second electrode are electrically connected to the channel region through the non-channel region, and the active layer has a thickness of 300 angstroms to 500 angstroms.

7. The display panel according to claim 1, wherein a first buffer layer is further provided between the light-absorbing layer and the first metal layer, and the first buffer layer is a silicon oxide layer.

8. The display panel according to claim 1, wherein the light-absorbing layer has a thickness of 1 to 3 microns.

9. The display panel according to claim 8, wherein the active layer comprises the channel region made of a semiconductor metal oxide material, the first electrode is a source, and the second electrode is a drain, and a vertical projection of the drain on the base substrate covers a vertical projection of the channel region on the base substrate.

10. The display panel according to claim 9, wherein the light-absorbing layer comprises a thiophene-based organic semiconductor material.

11. The display panel according to claim 9, wherein the driving circuit layer further comprises a gate insulating layer and a second metal layer stacked on the active layer in sequence, the second metal layer comprises a gate, and the gate is disposed corresponding to the channel region; and
    wherein the second metal layer is composed of an anti-reflection layer and a stacked metal layer, and the anti-reflection layer is located between the stacked metal layer and the gate insulating layer.

12. The display panel according to claim 11, wherein the anti-reflection layer is an indium zinc oxide film; and the stacked metal layer is a composite metal layer made of copper and molybdenum.

13. The display panel according to claim 9, wherein the active layer further comprises a non-channel region, the non-channel region is formed by conducting a semiconductor metal oxide material, the first electrode and the second electrode are electrically connected to the channel region through the non-channel region, and the active layer has a thickness of 300 angstroms to 500 angstroms.

14. The display panel according to claim 8, wherein a first buffer layer is further provided between the light-absorbing layer and the first metal layer, and the first buffer layer is a silicon oxide layer.

15. A method of manufacturing a display panel, comprising:
providing a base substrate;
forming a light-absorbing layer on the base substrate, wherein the light-absorbing layer is subjected to baking and thermal curing; and
forming a drive circuit layer on the light-absorbing layer, wherein the drive circuit layer comprises a first metal layer and an active layer, the first metal layer comprises a first electrode and a second electrode spaced apart in a same layer, and the active layer is disposed on the first metal layer and comprises a channel region; and
wherein a vertical projection of the light-absorbing layer on the base substrate covers a vertical projection of a gap between the first electrode and the second electrode on the base substrate;
wherein the vertical projection of the light-absorbing layer on the base substrate coincides with the vertical projection of the gap on the base substrate;
wherein the active layer comprises at least one via hole, and a vertical protection of the via hole on the base substrate does not overlap the vertical projection of the light-absorbing layer on the base substrate; and
wherein the display panel further comprises an LED light-shielding layer disposed on a side of the driving circuit layer away from the light-absorbing layer, and a vertical protection of the LED light-shielding layer on the base substrate covers the vertical protection of the via hole on the base substrate.

16. The method of manufacturing a display panel according to claim 15, wherein the baking and thermal curing comprises ultraviolet radiation curing and thermal baking, and the thermal baking is performed at a temperature of 200 to 250 degrees Celsius for 1 to 2 hours.

\* \* \* \* \*